US008511369B2

(12) United States Patent
Boday et al.

(10) Patent No.: US 8,511,369 B2
(45) Date of Patent: Aug. 20, 2013

(54) THERMALLY REVERSIBLE CROSSLINKED POLYMER MODIFIED PARTICLES AND METHODS FOR MAKING THE SAME

(75) Inventors: Dylan J. Boday, Tucson, AZ (US); Joseph Kuczynski, Rochester, MN (US); Robert E. Meyer, III, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 13/088,687

(22) Filed: Apr. 18, 2011

(65) Prior Publication Data

US 2012/0261064 A1 Oct. 18, 2012

(51) Int. Cl.
*F28D 15/00* (2006.01)

(52) U.S. Cl.
USPC ............. 165/185; 165/80.3; 252/62; 156/327

(58) Field of Classification Search
USPC .................. 165/80.3, 185; 252/62; 156/327
See application file for complete search history.

(56) References Cited

U.S. PATENT DOCUMENTS 3,435,003 A 3/1969 Craven
5,726,391 A 3/1998 Iyer et al.
5,760,337 A 6/1998 Iyer et al.
5,840,215 A 11/1998 Iyer et al.
5,853,622 A 12/1998 Gallagher et al.
5,904,796 A 5/1999 Freuler et al.
5,912,805 A 6/1999 Freuler et al.
6,315,038 B1 11/2001 Chiu
6,432,497 B2 8/2002 Bunyan
7,019,977 B2 3/2006 Lee et al.
7,025,129 B2 4/2006 Chiu
7,312,261 B2 12/2007 Sachdev et al.
7,346,259 B1 3/2008 Jen et al.
2003/0152766 A1 8/2003 Vargo et al.
2005/0161210 A1* 7/2005 Zhong et al. .................. 165/185
2007/0149711 A1 6/2007 Chaudhary et al.
2007/0290338 A1 12/2007 Kuczynski
2008/0075413 A1 3/2008 Jen et al.
2008/0226995 A1* 9/2008 Costanzo et al. ................. 430/8
2009/0146289 A1 6/2009 Lehman, Jr. et al.
2010/0220446 A1 9/2010 Tabei et al.
2010/0311936 A1 12/2010 Smith et al.
2011/0132537 A1 6/2011 Choi et al.

OTHER PUBLICATIONS

Bergman et al., "Mendable polymers," J. Mater. Chem., 2008, 18, 41-62.

Canary et al., Thermally Reversible Crosslinking of Polystyrene via the Furan-Maleimide Diels-Alder Reaction, Department of Chemistry, University of Hartford, West Hartford, Connecticut 06117, Journal of Polymer Science: Part A: Polymer Chemistry, vol. 30, 1755-1760 (1992).

(Continued)

*Primary Examiner* — Vu A Nguyen
(74) *Attorney, Agent, or Firm* — Cantor Colburn LLP

(57) ABSTRACT

Thermal insulating materials and methods of making the thermal insulating material generally include a plurality of thermally reversible crosslinked polymer modified particles. The thermally reversible crosslinked polymer modified particles include a polymer containing a plurality of a first functional group; and a modified particle having a plurality of pendent cross-linking agents containing a second functional group, wherein the first functional group and the second functional group are complementary reactants to a reversible cross-linking reaction.

10 Claims, 2 Drawing Sheets

10
14
16
12

(56) References Cited

OTHER PUBLICATIONS

Dow Corning Electronics and Advanced Technologies, "Silicone Grease Solutions for Your Thermal Interface Needs", undated, Powerpoint slides; http://www.dowcorning.com/content/publishedlit/11-1712-01.pdf; 38 pages.

Syrett et al., "Self-healing and self-mendable polymers," Polymer Chem., 2010, 1, 978-987.

Topspin Design Co., "Boron Nitride Products for Thermal Solutions", 2006; http://ww.topspindesign.com/tw/media/documents/tsd_bn_solutions.pdf; 15 pages.

* cited by examiner

THERMALLY REVERSIBLE CROSSLINKED POLYMER MODIFIED PARTICLES AND METHODS FOR MAKING THE SAME

BACKGROUND OF THE INVENTION

This invention relates generally to thermally reversible crosslinked polymer modified particles and methods for making the same.

The rapid technology advancements in high performance electronics packaging have focused on reduced size and higher operating speed. This has resulted in excessive heat generation during device operation. There is an accompanying need for effective heat dissipation methods to maintain the reliable functional performance of assembled electronic products. The commonly used methods of cooling include helium filled modules, solder thermal interfaces, thermal greases, elastomeric silicone gels, thermoplastic polymers with thermally conductive fillers such as AN, BN, ZnO, and more recently, phase change materials (PCM), and conductive adhesives. These provide the thermal interface between the silicon device chip and a high thermal conductivity metal lid or heat sink to allow a path for heat dissipation from the high power density circuit devices during operation.

Thermal grease is spread as a thin layer between the back of the die and the heat sink. Thermal grease has low thermal resistance and can be easily reworked. However, it is subject to pump-out and drying which causes voids at the interface. This degrades the device performance with time due to an increase in interfacial resistance. The phase change materials (PCM) are low melting waxes. Examples include paraffin wax having graphite particles dispersed in the wax matrix, and silicone based materials, such as alkyl methyl silicones, which can be used as pre-formed tapes or melt dispensed across interfaces. They provide low thermal impedance and high thermal conductivity, typically in the range 5 W/m ° K in thin bond line thickness. However, the pre-cut films of these materials are fragile and also have the problems of performance degradation and variability, delamination, bleed-out, and out-gassing, and furthermore generally require fasteners, such as clips or screws to hold the PCM in place.

Another category of thermal interface materials is conductive adhesives which can be used as a thin adhesive layer between the heat sink or the lid and the back side of a silicon die in a flip-chip module assembly. The commercially available conductive adhesives are typically Ag-filled and ceramic-filled epoxy based materials including flexible epoxies. They are medium to high modulus adhesives (>100,000 psi at room temperature). It is generally known that cured coatings of such materials have high intrinsic stress which can cause disruption of interface integrity due to delamination. This results in increased contact resistance with a corresponding decrease in the heat dissipation effectiveness at the interface. The commercially available Ag-filled adhesives also have no simple and practical rework method available. Therefore, they cannot be readily removed or reworked from contacting surfaces. The non-reworkability of these adhesives presents a serious drawback in that it does not allow for defect repair, component recovery, recycling or reuse of high cost semiconductor devices, heat sinks and substrates.

Desirable properties for thermal interface materials include: the ability to form a thin bond line with uniform thickness across interfaces, low thermal impedance, low stress and compliant systems for interface integrity during device operation, stable interfacial contact resistance in T/H (temperature/humidity) and T/C (thermal cycling), TCR (temperature coefficient of resistance) stability, and reworkability for defect repair and reclamation of high cost module components. The preferred materials should also be amenable to removal from contacting surfaces to allow reworking without causing any damage to the module materials, particularly special type lids having high thermal conductivity.

The ability to rework and recover components to recover production yield loss, reduce waste, and provide cost reduction has become more important in the fabrication of high performance electronic products. A rework option for a cured thermally conductive film offers the major benefit of recovery/reclamation and reuse of potentially expensive high thermal conductivity lid materials, sensitive components, or voltage transformation modules. Moreover, a rework option may provide a cost effective way to obtain significant increases in heat dissipation capability with the use of high thermal conductivity cooling elements in conjunction with a thermal interface adhesive.

In view of the limitations in the use of conventional interface materials, there is a need for improved thermal interface materials (TIMs) with efficient heat dissipation from high power density devices. There is also a need for a practical method to selectively remove and/or rework the cured deposits/residue of these materials from various component surfaces/interfaces to which the materials are adhered.

SUMMARY OF THE INVENTION

Exemplary embodiments include a thermal insulating material, comprising a plurality of thermally reversible crosslinked polymer modified particles. In an embodiment, the thermally reversible crosslinked polymer modified particles comprise a polymer containing a plurality of a first functional group; and a modified particle having a plurality of pendent cross-linking agents containing a second functional group, wherein the first functional group and the second functional group are complementary reactants to a reversible cross-linking reaction.

Further exemplary embodiments include a thermally reversible crosslinked polymer modified particle comprising one or more 4+2 cycloaddition moieties, wherein the 4+2 cycloaddition moieties are reversibly thermally reactive to provide a polymer consisting essentially of diene moieties and dienophile moieties pendent from a functionally modified particle.

Additional exemplary embodiments include a method of making a thermal interface between a first element, which is configured to generate heat during operation, and a second element, which is configured to transfer away the heat generated by the first element comprising applying a thermal interface material to at least one of the first element or the second element to form a layer of thermal interface material, the thermal interface material comprising thermally reversible crosslinked polymer modified particles.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
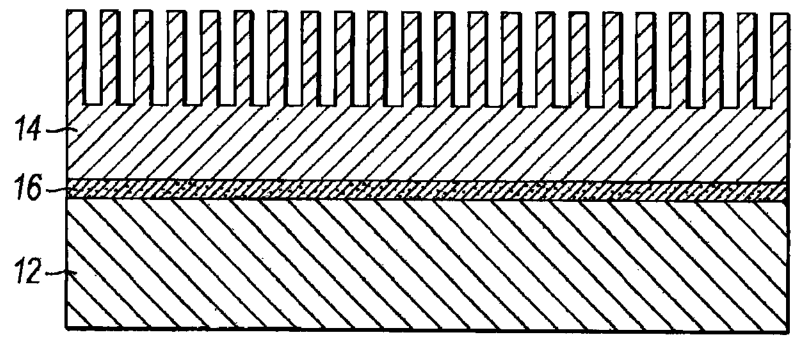
FIG. 1 illustrates a cross-sectional view of an electrical component and a heat sink connected by a thermal interface material (TIM) layer according to one embodiment of the present invention.

Embodiments of the present invention relate to an electronic assembly that includes a first element configured to generate heat during operation, a second element configured to transfer away the heat generated by the first element; and a layer of a thermal interface material situated between the first element and the second element. As shown in FIG. 1, an electronic chip module 10 includes an electronic chip 12, a heat sink 14, and a layer of thermal interface material 16 situated between and in intimate contact with both the electronic chip 12 and the heat sink 14. The configuration represented in FIG. 1 is known in the art as TIM 1.

Figure 2:
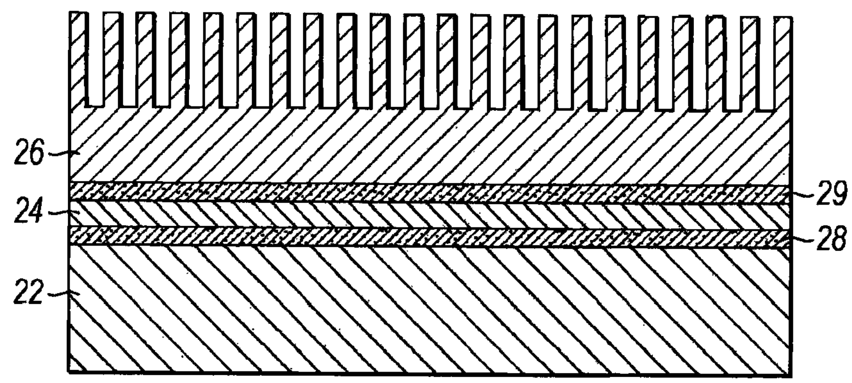
FIG. 2 illustrates a cross-sectional view of an electrical component, a lid, and a heat sink where the component, lid and heat sink are connected by two layers of TIM according to another embodiment of the present invention.

With reference to FIG. 2, another configuration for an electronic chip module 20 includes an electronic chip 22, a lid 24, and a heat sink 26. A first layer of thermal interface material 28 is situated between and in intimate contact with both the electronic chip 22 and the lid 24, and a second layer of thermal interface material 29 is situated between and in intimate contact with both the lid 24 and the heat sink 26. The configuration represented in FIG. 2 is known in the art as TIM 2.

More specifically, embodiments of the invention relate to a thermal interface material including a thermally-reversible crosslinked polymer modified particle that functions as a thermally reversible adhesive that is suitable for use as a thermal interface between an electronic chip or silicon device and a heat sink/lid in an integrated circuit or a microelectronic assembly. More particularly, this invention is directed to thermal interface materials having improved functional performance and a method to rework the thermal interface materials to allow recovery, recycling, or reuse of the heat sink assembly components without causing any detriment to the device chip or the chip carrier.

According to embodiments of the invention, the thermal interface material (TIM) includes thermally-reversible crosslinked polymer modified particles, wherein the modified particles are thermally-conductive, electrically non-conductive, and have been modified to provide thermally-reversible adhesive properties. As used herein, "electrically non-conductive" and "electrically insulating" may be used interchangeably and mean that, under the normal operating conditions of an integrated circuit (IC) device incorporating the TIM of the present invention, the TIM does not conduct electricity between the IC and a heat sink. As such, the TIM compositions of the embodiments of the present invention retain the requisite electrically insulating characteristics, while advantageously attaining the desired high thermal conductivity.

The thermally-reversible character of the adhesive component is achieved by utilizing a polymer containing a plurality of a first functional group; and a cross-linking agent containing a plurality of a second functional group, where the first functional group and the second functional group are complementary reactants to a reversible cross-linking reaction, which enables the reversible thermosetting of the adhesive. One exemplary thermally reversible cross-linking reaction includes, but is not limited to, a Diels-Alder [4+2] cycloaddition reaction between a diene-functionalized polymer and functionalized particles having attached thereto pendent dienophile-functionalized cross-linking agents having a functionality greater than one. Conversely, a complementary reversible cross-linking reaction includes a Diels-Alder 4+2 cycloaddition reaction between a dienophile-functionalized polymer and functionalized particles having attached thereto pendent diene-functionalized cross-linking agent having a functionality greater than one.

The type of polymer is not particularly limited. Suitable polymers include acrylics, epoxies, fluoropolymers, imides, methacrylates, polyacrylates, polyamides, polybutadienes, polycarbonates, polyesters, polypropylenes, polyurethanes, polyvinyl chloride, siloxanes and combinations thereof. According to embodiments of the invention, the polymer includes a functionality that permits the covalent bonding of the plurality of the first functional group to the backbone of the polymer. The first functional group may be attached directly to the polymer backbone via a chemical bond or via a divalent organic bridging group. Examples of suitable chemical bonds include, but are not limited to, amine, amide, ester, ether, halide or sulfide bonds. Examples of suitable bridging groups include, but are not limited to, substituted or unsubstituted alkyl, aryl, alkenyl, or cycloalkyl groups. These bridging groups may include hetero atoms, such as nitrogen, oxygen or sulfur. Accordingly, the first functional group may be covalently bonded to the polymer through a nitrogen containing group.

According to one embodiment of the invention, the first functional group is a diene moiety, such as a 5-membered ring having two endocyclic double bonds. Exemplary diene moieties include furans, pyrroles, or thiophenes. In one example, the diene moiety is a furan. According to another example, the furan is covalently bonded to the polymer at the 2-position, whereby the 3, 4, and 5 positions are unsubstituted.

Thus, according to another embodiment of the present invention, a polymer bearing one or more first functional groups may be derived from the reaction product of a halogenated siloxane polymer and furfuryl alcohol, for example. Accordingly, one example, as shown in Scheme 1, includes the reaction product of chlorine-terminated methylsiloxane and furfuryl alcohol to yield the corresponding bisfuransiloxane.

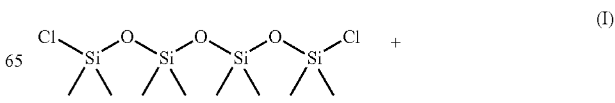

(I)

-continued

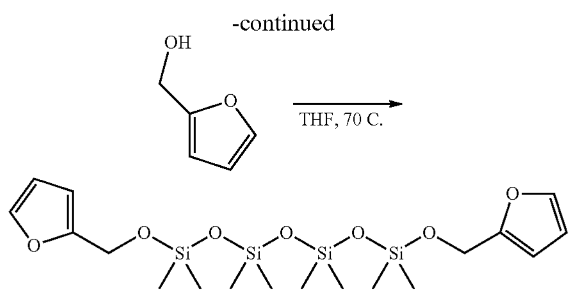

The molecular weight of the polymer(s) on which the thermally-reversible adhesive(s) is/are based may vary between wide limits. For example, the polymer(s) may have a number average molecular weight within the range of about 300 to about 30,000.

According to another embodiment of the invention, the second functional group is a dienophile moiety. The second functional group is covalently attached to the thermally conductive particles. In accordance with one embodiment, the thermally conductive particles are first functionalized (i.e., modified) such as for example, by a condensation reaction of pendent hydroxyl groups with aminopropyltriethoxysilane to provide amine functionalization.

Scheme (II) provides an exemplary pathway for forming the functionalized thermally conductive particles.

(II)

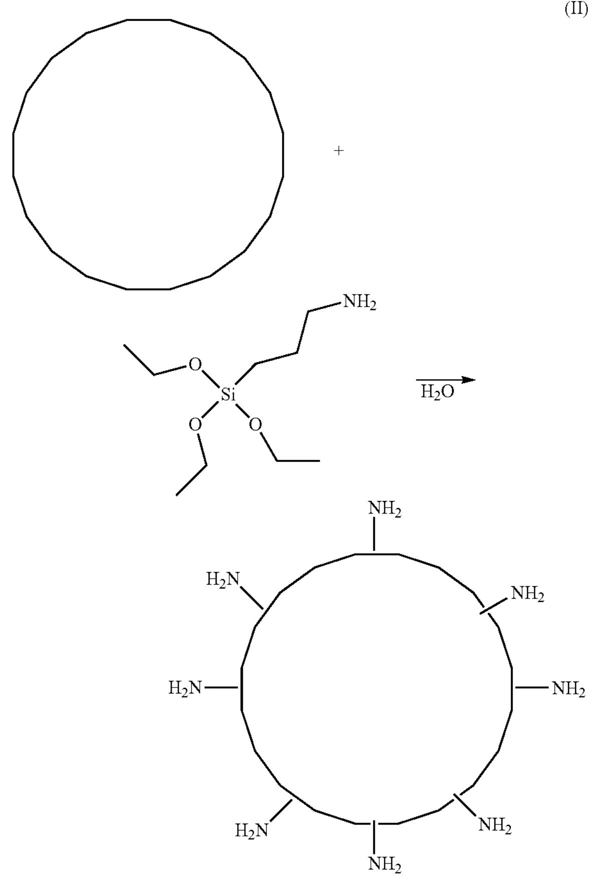

The functionalized particles are then reacted with a suitable dienophile precursor moiety to form dienophile functionalized particles. Accordingly, one example, as shown in Scheme III, can include the reaction of maleic anhydride and the amine functionalized particles to yield maleimide functionalized particles, which can now function as a dienophile.

(III)

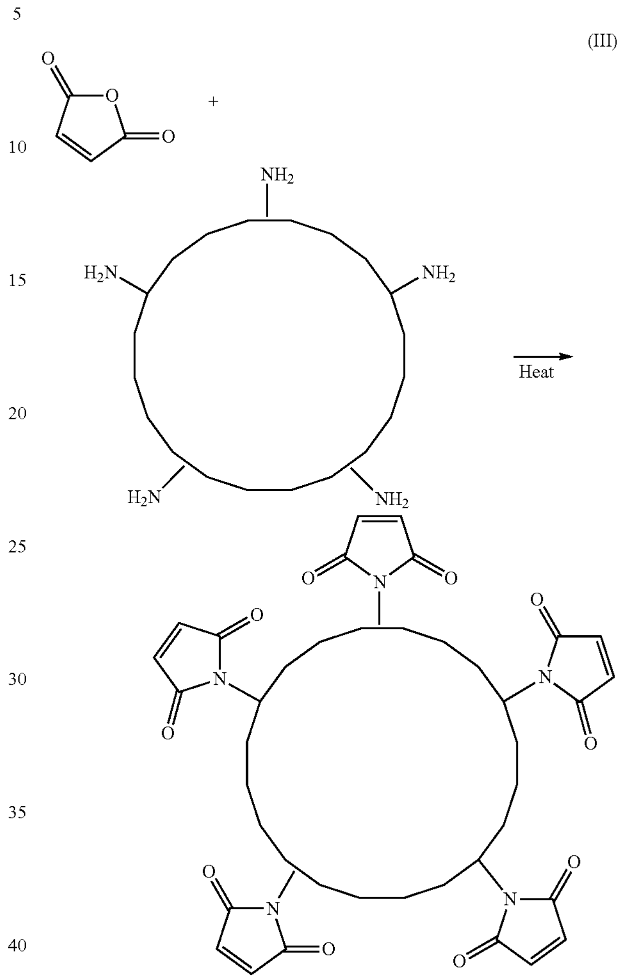

The precise nature of the dienophile from which the Diels-Alder adduct is obtained is not critical, as long as the Diels-Alder adduct has such a thermal stability that the cross-linked adhesive is reworkable. Usually the minimum temperature above which the reworkable crosslinked resin will be reworked depends on the maximum temperature requirements for the IC device used. The reworking is typically carried out at a temperature from about 100° C. to about 250° C. For example, the rework temperature may be about 200° C.

Suitable dienophile moieties include compounds having a di-substituted alkene bearing electron withdrawing groups on both sides of the double bond. Suitable electron withdrawing groups include, for example, ester, amide or keto groups. Dienophiles also include compounds which contain a but-2-ene-1,4-dione moiety that are contained in a 5- or 6-membered ring. For example, the second functional group may be a maleimide (i.e., a 5-membered ring) moiety. Examples of other suitable dienophiles include, bis(triazolinediones), bis(phthalazinediones), quinones, bis(tricyanoethylenes), bis(azodicarboxylates); diacrylates, maleate or fumarate polyesters, acetylenedicarboxylate polyesters.

Suitable thermally conductive particles that can be functionalized include, but are not limited to, plastics, rubbers, ceramics, electrically insulated metals, glasses, and like materials. The particles may be an epoxy, silicone, silicone polyester copolymer, or elastomer. The particles may also include other particles of a material to enhance thermal conductivity that may be but are not limited to an electrically insulated metal or ceramic material, so as to promote heat transfer through the filler. The particles may be selected from, among other things, aluminum oxide, titanium dioxide, boron nitride, aluminum nitride, dielectrically coated copper, anodized aluminum or any combination thereof. In one example, the particles are selected from the group consisting of boron nitride, titanium dioxide, aluminum nitride, alumina, and combinations thereof.

The particles are not particularly limited to any specific morphology, in that the filler may be in the form of irregular shaped particles, spheres, needles, plates, or combinations thereof.

According to one aspect of the invention, the thermally-reversible crosslinked polymer modified particles can be formed by combining the furanized polymer (e.g., the diene) of Scheme (I) with the dienophile moiety modified particles of Scheme (III) to form a homogenous mixture. Advantageously, the mixture is not set (i.e., not cross-linked) at room temperature as the cross-linking Diels-Alder cycloaddition reaction typically has an onset temperature well above room temperature, e.g., about 90° C. and higher. Similar to other thermosetting materials, this characteristic permits the thermally-reversible adhesive to be combined with the filler and thereby form a TIM material, which may be applied and sandwiched between a heat sink and an electronic chip in an uncross-linked state. Heating the TIM (and heat sink/electronic chip) to a temperature above the onset temperature induces the formation of Diels-Alder adducts and thereby yields a cross-linked polymer. For example, heating a composition that includes the furanized polymer (i.e., diene) and modified particles having attached thereto the cross-linking agent (i.e., dienophile) to above its onset temperature yields thermally reversible cross-linked polymer modified particles. Alternatively, the TIM may be applied at a temperature above the reversion or reworking temperature, as described in more detail below.

The quantity of Diels-Alder adducts present in the thermally reversible adhesive component depends on the quantity of furan groups in the polymer and the amount of the modified particles having attached thereto cross-linking agent present in the composition. Advantageously, since most TIMs are heavily filled with (unmodified) thermally conductive particles, higher loading levels can be achieved to provide finer control over the cohesive strength provided by the thermal interface material.

One skilled in the art will appreciate that a certain minimum quantity of Diels-Alder adducts is needed to be present to ensure that the TIM is a viscoelastic material below the temperature at which the Diels-Alder adducts undergoes reversion to the furan and the dienophile. It will also be appreciated that this minimum quantity also is a function of the molecular weight and the type of the polymer on which the adhesive is based. Lower molecular weight polymers will require a higher quantity of Diels-Alder adducts. Conversely, the number of a Diels-Alder adducts may be lower when a cross-linking agent having a higher functionality is used.

Additionally, the relative stoichiometry between the diene and the dienophile affects the final properties of the thermally reversible adhesive. For any given furanized polymer, the mole percent of a cross-linking agent is about 50% or less relative to the moles of furan moieties in the polymeric mixture. For example, the mole percent of a cross-linking agent may be about 25 mole percent or less, about 15 mole percent or less, or about 10 mole percent or less.

An example of a thermally conductive particle is a boron nitride industrial powder manufactured under the name COMBAT®, grade PH (325, by Saint-Gobain Adraneed Nitride Products, Amherst, N.Y. 14228-2027). This boron nitride powder enhances the heat conducting properties of the TIM composition, but is chemically inert.

The particles amount used in the TIM composition may vary depending on the desired or requisite level of thermal conductivity for the intended application. However, the particles are generally present in an amount effective to provide a thermal conductivity of 0.2 W/m-K or more, and an electrical resistivity of $9\times10^{11}$ ohm-cm or more. Accordingly, the filler may be present in the TIM in an amount ranging from about 5% to about 70% by weight based on the total weight of the composition. For example, the particles may be present in an amount ranging from about 15% to about 60%; about 5% to about 15%; about 25% to about 60%; or about 40% to about 70%.

According to one aspect of the present invention, a TIM is formed by combining thermally-reversible adhesive, and thermally conductive and electrically non-conductive filler. As described in detail above, the thermally-reversible adhesive includes a polymer containing a plurality of a first functional group; and modified particles having attached thereto a cross-linking agent containing a plurality of a second functional group, where the first functional group and the second functional group are complementary reactants to a reversible cross-linking reaction. The resultant TIM is electrically insulating and has an electrical resistivity of $9\times10^{11}$ ohm-cm or more. Accordingly, the electrical resistivity may be $10^{12}$ ohm-cm or more; $10^{13}$ ohm-cm or more, $10^{15}$ ohm-cm or more. Additionally, the resultant TIM is highly thermally conductive and has a thermal conductivity equal to or greater than 0.2 W/m-K. Accordingly, the thermal conductivity may be 0.2 W/m-K or more; 1 W/m-K or more; 3 W/m-K or more; or 6 W/m-K or more.

The adhesive strength of the TIM should be sufficient to maintain the bonding between the electronic chip 12 and the heat sink 14 of FIG. 1, or the electronic chip 22, lid 24, and heat sink 26 of FIG. 2 during the assembly process, as well as during normal operation of the components. For example, the adhesive strength after thermally setting the TIM may be between 1.0 and 20.0 MPa at about 25° C. However, the adhesive strength of the TIM should be substantially less at the reworking temperature. In practice, this adhesive strength limit at a given rework temperature is determined empirically and is based on what the component manufacturer specifies as the maximum tensile load a component can tolerate. For example, at the reworking temperature, the adhesive strength should be about 50% or less than that of the adhesive strength at 25° C. The reworking bond strength may be about 25% to about 10% of the adhesive strength at 25° C.

Based on all of the foregoing, one embodiment of the present invention includes a method of reversibly adhering a first element, which is configured to generate heat during operation, and a second element, which is configured to transfer away the heat generated by the first element. Accordingly, the method includes applying a thermal interface material to at least one of the first element or the second element to form a layer of thermal interface material, and sandwiching the layer of thermal interface material between the first element and the second element to thereby reversibly combine the first element and the second element. The simplified embodiment depicted in FIG. 1 illustrates a TIM 1 configuration of the chip 12 and the heat sink 14 adhered together with a layer of thermal interface material 16 of the present invention. Similarly, the simplified embodiment depicted in FIG. 2 illustrates a TIM 2 configuration having the chip 22, the lid 24 and the heat sink 26 adhered together with the first layer 28 and the second layer 29 of the thermal interface material of the present invention.

As previously described, the assembled modules 10, 20 can be heated to an onset temperature of the reversible cross-linking reaction to set the thermally-reversible adhesive. Alternatively, the thermal interface material, which includes the thermally-reversible adhesive, and the thermally conductive and electrically non-conductive filler, may be applied to the first element and/or the second element at a temperature near the reworking temperature, which upon cooling reverts to the cross-linked state.

Further, micro-electronics fabrication processes often require disassembly of assembled components. Typical reasons include carrying out diagnostic tests, to replace or repair the semiconductor device, or to recover electrically good substrates from test vehicles or early user hardware used to assess product performance and reliability prior to actual product release. As such, to remove an adhered chip 12 from the heat sink 14 of FIG. 1, the assembled module 10 may be heated to or above the rework temperature, where the reversible adhesive reverts to a substantially uncross-linked state and the adhesive strength of the TIM is reduced to allow the chip 12 to be removed from the heat sink 14. Accordingly, the assembled module may be heated to a temperature of about 200° C. or more, for example to about 250° C., to facilitate ease of separation for the chip 12 and the heat sink 14.

Figure 3:
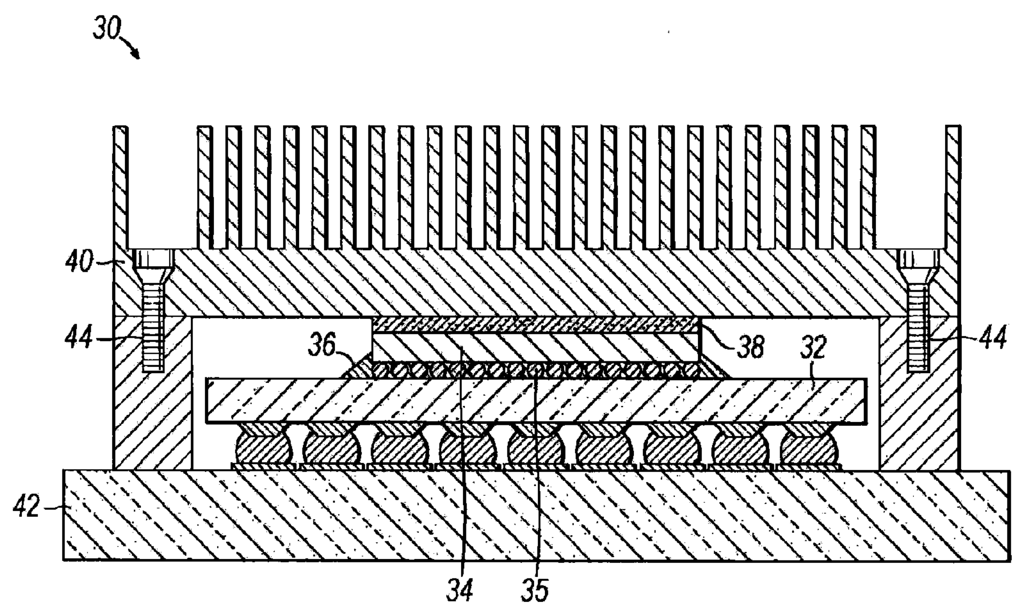
FIG. 3 illustrates a cross-sectional view of a single integrated circuit chip module and heat sink connected with a TIM layer according to another embodiment of the present invention.

FIG. 3 shows a more detailed example of a typical single chip module 30 having a ceramic chip carrier or substrate 32 with a single chip 34 attached through solder joints 35, which are encapsulated with an underfill polymer 36. For heat dissipation from the functioning device, a thermal interface material layer 38 (TIM) of the present invention is dispensed on the back side surface of the chip 34 and a metal heat sink 40 is bonded to the chip 34 with the TIM 38 as the thermal interface for conducting heat away from the chip 34 to heat sink 40. The heat sink 40 may be further attached to a base 42 using fasteners 44.

Figure 4:
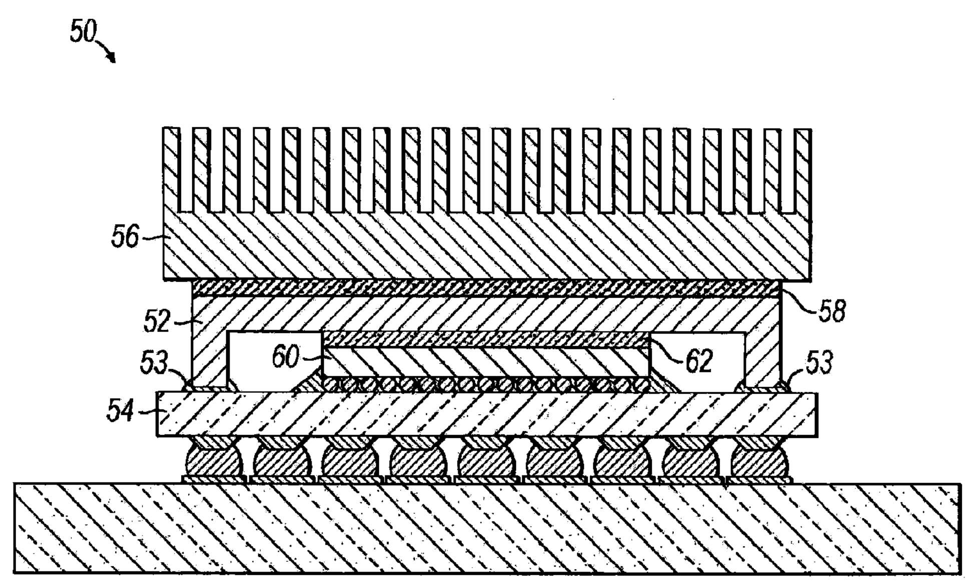
FIG. 4 illustrates a cross-sectional view of a single integrated circuit chip module, a protective cover and a heat sink where the module, protective cover and heat sink are connected with two layers of TIM according to yet another embodiment of the present invention.

FIG. 4 shows a conventional single chip module 50, similar to FIG. 3 but additionally shows a protective cap 52 attached to the substrate 54 with an adhesive joint 53 and a heat sink 56 is attached to the protective cap 52 by a layer of TIM 58. The protective cap 52 is also in contact with the chip 60 via another layer of TIM 62. The two layers of TIM 58, 62 may include the reversibly adhesive thermal interface materials of the present invention, or one can be a conventional material such as a conductive silicone polymer and the second can be one of the TIMs disclosed herein.

Thus, as shown in FIGS. 3 and 4, the assembled modules 30, 50 may have multiple junctions, connections, or components that could fracture under the force necessary to overcome the adhesive or bonding strength of a typical thermoset adhesive composition. However, the thermal interface materials of the embodiments of the present invention afford desirable adhesive strengths to maintain the assembled modules in their set positions under their normal operating conditions, while providing a mechanism to substantially reduce the bond strength when needed. Accordingly, there is provided a practical rework method for various component surfaces/interfaces to which the materials are adhered. Further, these improved thermal interface materials (TIMs) provide efficient heat dissipation from high power density devices, while maintaining the requisite electrical insulation.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A thermal insulating material disposed between a heat generating device and a heat sink for thermally and reversibly bonding the heat sink to the heat generating device, the thermal insulating material comprising:

a plurality of thermally reversible crosslinked polymer modified particles having a first adhesive strength at a first temperature effective to bond the heat sink to the heat generating device and a second adhesive strength less than the first adhesive strength at a second temperature greater than the first temperature effective to permit removal of the heat sink from the heat generating device, wherein the heat generating device is an electronic chip or a silicon device.

2. The thermal insulating material disposed between the heat generating device and the heat sink of claim 1, wherein the thermally reversible crosslinked polymer modified particles comprise a polymer containing a plurality of a first functional group; and a modified particle having a plurality of pendent cross-linking agents containing a second functional group, wherein the first functional group and the second functional group are complementary reactants to a reversible cross-linking reaction.

3. The thermal insulating material disposed between the heat generating device and the heat sink of claim 2, wherein the particles comprise plastics, rubbers, ceramics, electrically insulated metals, glasses, and mixtures thereof.

4. The thermal insulating material disposed between the heat generating device and the heat sink of claim 2, wherein the polymer is selected from the group consisting of acrylics, epoxies, fluoropolymers, imides, methacrylates, polyacrylates, polyamides, polybutadienes, polycarbonates, polyesters, polypropylenes, polyurethanes, polyvinyl chloride, siloxanes and combinations thereof.

5. The thermal insulating material disposed between the heat generating device and the heat sink of claim 2, wherein the plurality of the first functional group is covalently bonded to the polymer through a nitrogen, oxygen or sulfur-containing group.

6. The thermal insulating material disposed between the heat generating device and the heat sink of claim 2, wherein the first functional group is a diene moiety covalently bonded to the polymer through an oxygen containing group.

7. The thermal insulating material disposed between the heat generating device and the heat sink of claim 2, wherein the polymer comprises a reaction product of a halogen terminated siloxane polymer and a furfuryl alcohol moiety.

8. The thermal insulating material disposed between the heat generating device and the heat sink of claim 2, wherein the second functional group is a dienophile moiety.

9. The thermal insulating material disposed between the heat generating device and the heat sink of claim 2, wherein the cross-linking agent comprises a plurality of a maleimide moiety.

10. The thermal insulating material disposed between the heat generating device and the heat sink of claim 2, wherein the particles is selected from the group consisting of boron nitride, aluminum nitride, titanium dioxide, and alumina.

* * * * *